(12) United States Patent
Yu et al.

(10) Patent No.: US 9,087,960 B2
(45) Date of Patent: Jul. 21, 2015

(54) LIGHT EMITTING DIODE AND METHOD OF FABRICATING THE SAME

(71) Applicant: LEXTAR ELECTRONICS CORPORATION, Hsinchu (TW)

(72) Inventors: Chang-Chin Yu, Zhubei (TW); Hsiu-Mu Tang, Hsinchu (TW); Mong-Ea Lin, Taipei (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 13/911,481

(22) Filed: Jun. 6, 2013

(65) Prior Publication Data
US 2013/0328057 A1 Dec. 12, 2013

(30) Foreign Application Priority Data
Jun. 7, 2012 (TW) .............. 101120484 A

(51) Int. Cl.
H01L 31/0256 (2006.01)
H01L 33/32 (2010.01)
H01L 33/00 (2010.01)
H01L 33/20 (2010.01)
H01L 33/42 (2010.01)

(52) U.S. Cl.
CPC ............ *H01L 33/32* (2013.01); *H01L 33/0075* (2013.01); *H01L 33/20* (2013.01); *H01L 33/007* (2013.01); *H01L 33/42* (2013.01)

(58) Field of Classification Search
CPC ............................ H01L 33/32; H01L 33/0075
USPC ............................................. 257/76; 438/46
See application file for complete search history.

(56) References Cited

U.S. PATENT DOCUMENTS

| 4,718,019 | A  | * | 1/1988  | Fillion et al. | 250/398 |
|-----------|----|---|---------|----------------|---------|
| 7,733,007 | B2 |   | 6/2010  | Erchak         |         |
| 2006/0086942 | A1 | * | 4/2006  | Wu et al. | 257/98 |
| 2006/0118794 | A1 | * | 6/2006  | Lee et al. | 257/82 |
| 2010/0276665 | A1 | * | 11/2010 | Wang | 257/15 |
| 2011/0215352 | A1 | * | 9/2011  | Jeong et al. | 257/94 |
| 2013/0341589 | A1 | * | 12/2013 | Yu et al. | 257/13 |

FOREIGN PATENT DOCUMENTS

| TW | 200832759 A | 8/2008 |
| TW | 201117283 A | 5/2011 |
| TW | 201128801 A | 8/2011 |
| TW | 201214747 A | 4/2012 |

OTHER PUBLICATIONS

The Free Dictionary by Farlex as found by this link http://www.thefreedictionary.com/trapezoid as cited from American Heritage Dictionary fifth edition Houghton Mifflin Harcourt Publishing 2011.*

* cited by examiner

*Primary Examiner* — David S Blum
(74) *Attorney, Agent, or Firm* — Moser Taboada

(57) ABSTRACT

Disclosed herein is a light emitting diode, the structure of the light emitting diode comprises a substrate, a first-type semiconductor layer, a structural layer, a light emitting layer, a second-type semiconductor layer, a transparent conductive layer, a first contact pad and a second contact pad in regular turn. The structural layer comprises a stacked structure having a trapezoid sidewall and nano columns extending from the trapezoid sidewall in regular arrangement. Also, a method for fabricating the light emitting diode is disclosed.

10 Claims, 5 Drawing Sheets

LIGHT EMITTING DIODE AND METHOD OF FABRICATING THE SAME

RELATED APPLICATIONS

This application claims priority to Taiwan Application Serial Number 101120484, filed Jun. 7, 2012, which is herein incorporated by reference.

BACKGROUND

1. Field of Invention

The present invention relates to a light-emitting diode and the fabricating method. More particularly, the present invention relates to a light-emitting diode having nano columns and the fabricating method.

2. Description of Related Art

In recent years, light-emitting diodes (LEDs) have been widely used in illumination because of its long service life and compact size. However, to further replace the traditional lighting apparatus, the LEDs need to improve themselves at the luminous efficiency for higher brightness and lower heat generation.

Structurally, the LEDs is stacked by a continuous epitaxial growth, and the multi-quantum well therein is in a structure of platform, which limits the light emitting in an area same as that of the substrate of the stacked structure of an LED. Traditionally, the brightness of the LED is enhanced by way of forming a nano-scale structure on a multi-quantum well layer which increases the surface area thereof. However, since the formed nanostructure is randomly disordered and the improvement of the luminous efficiency is still limited.

SUMMARY

The following presents a summary of the disclosure to provide a basic understanding to the reader. This summary is not an extensive overview of the disclosure and it does not identify key/critical elements of the present disclosure or delineate the scope of the present disclosure. Its sole purpose is to present some concepts disclosed herein in a simplified form as a prelude to the more detailed description that is presented later.

An aspect of the present disclosure provides a light emitting diode (LED), comprising a substrate, a structural layer, a transparent conductive layer, a first contact pad and a second contact pad. A cushion layer is formed on a surface of the substrate and comprises a first area and a second area. A first-type semiconductor layer comprises a first portion and a second portion respectively disposed in the first area and the second area. The structural layer is disposed on the cushion layer of the second area, and the structural layer comprises the second portion of the first-type semiconductor layer, a light emitting layer and a second-type semiconductor layer. The light emitting layer is disposed on the second portion of the first-type semiconductor layer. The second-type semiconductor layer is disposed on the light emitting layer. The structural layer is composed of a stacked structure and nano columns, and the nano columns are extending from a trapezoid sidewall in regular arrangement. The first contact pad is disposed on the first-type semiconductor layer in the first area of the cushion layer. The transparent conductive layer is disposed on the stacked structure of the structural layer in the second area of the cushion layer. A second contact pad is disposed on the transparent conductive layer.

According to one embodiment of the disclosure, the ratio between the diameter of the nano columns and the thickness of the structural layer is in a range of 0.01 to 1, and the distance between the nano columns is in a range of 1 to 500 nanometers (nm).

According to another embodiment of the disclosure, the substrate is made of a sapphire substrate or a silicon substrate.

According to yet another embodiment of the disclosure, the first-type semiconductor layer is an N-type semiconductor layer, and the second-type semiconductor layer is a P-type semiconductor layer. The N-type semiconductor layer is made a doped N-type impurity nitride semiconductor, and the P-type semiconductor layer is made a doped P-type impurity nitride semiconductor. The first-type semiconductor layer is an N-type gallium nitride layer, and the second-type semiconductor layer is a P-type gallium nitride layer.

According to one embodiment of the disclosure, the light emitting layer is a multi-quantum well layer, and the multi-quantum well layer comprises at least one gallium nitride layer and at least one indium gallium nitride layer.

An aspect of the present disclosure provides a method for fabricating a light emitting diode, and steps comprise the following. First a substrate is provided, and a cushion layer, a first-type semiconductor layer, a light emitting layer and a second-type semiconductor layer are sequentially formed on the substrate by an epitaxial growth process. Next, by an photolithography and etching processes, the first-type semiconductor layer, the light emitting layer and the second-type semiconductor layer are defined for exposing the first-type semiconductor layer in the first area, and a platform having the first-type semiconductor layer, the light emitting layer and the second-type semiconductor layer are formed in a position other than the first area. Then a plurality of nano-scale masks are formed in regularly space on the platform, and a cross-sectional trapezoid hard mask is formed on the platform to cover the nano-scale masks where a light emitting diode stacked structure to be formed. By an anisotropic etching process, the portion of the platform not covered by the trapezoid hard mask and the nano-scale masks is removed to form a stacked structure having a trapezoid sidewall and nano columns extending from the trapezoid sidewall in regular arrangement, in which the first-type semiconductor layer is as an etching endpoint. The trapezoid hard mask and the nano-scale masks are then removed. A transparent conductive layer is formed on the second-type semiconductor layer of the light emitting diode stacked structure having a trapezoid sidewall. A first contact pad is formed on the first portion of the first-type semiconductor layer in the first area, and a second contact pad is formed on the transparent conductive layer.

According to one embodiment of the disclosure, the step of forming the nano-scale masks is performed by a nano imprint lithography process or a photolithography etching process.

According to one embodiment of the disclosure, the photolithography etching process is a dry etching process or a wet etching process.

According to another embodiment of the disclosure, the anisotropic etching process is an inductively coupled plasma etching process or reactive ion etching process.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
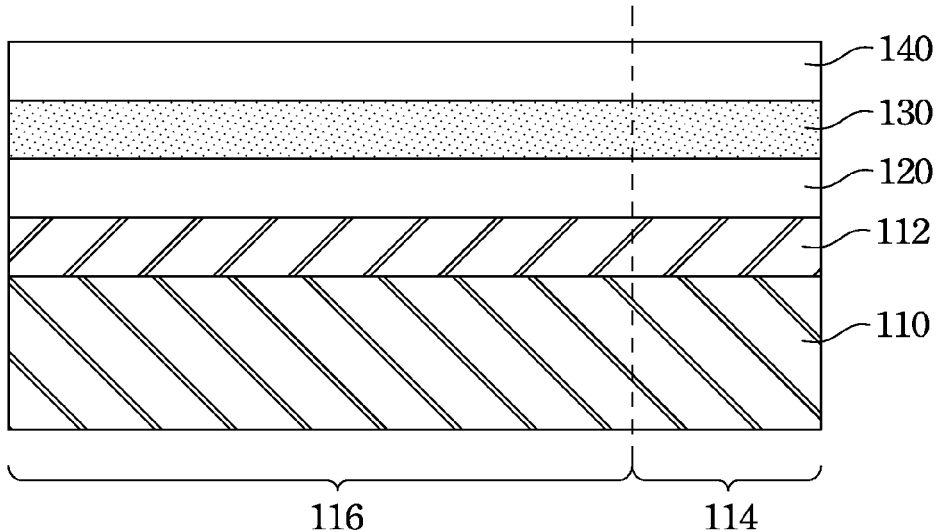
FIG. 1A to 1I are cross-sectional views illustrating process steps of fabricating a light emitting diode according to one embodiment of this invention.

Reference will now be made in detail to the present embodiments of the invention, examples of which are illustrated in the accompanying drawings. Wherever possible, the same reference numbers are used in the drawings and the description to refer to the same or like parts.

Figure 1B:
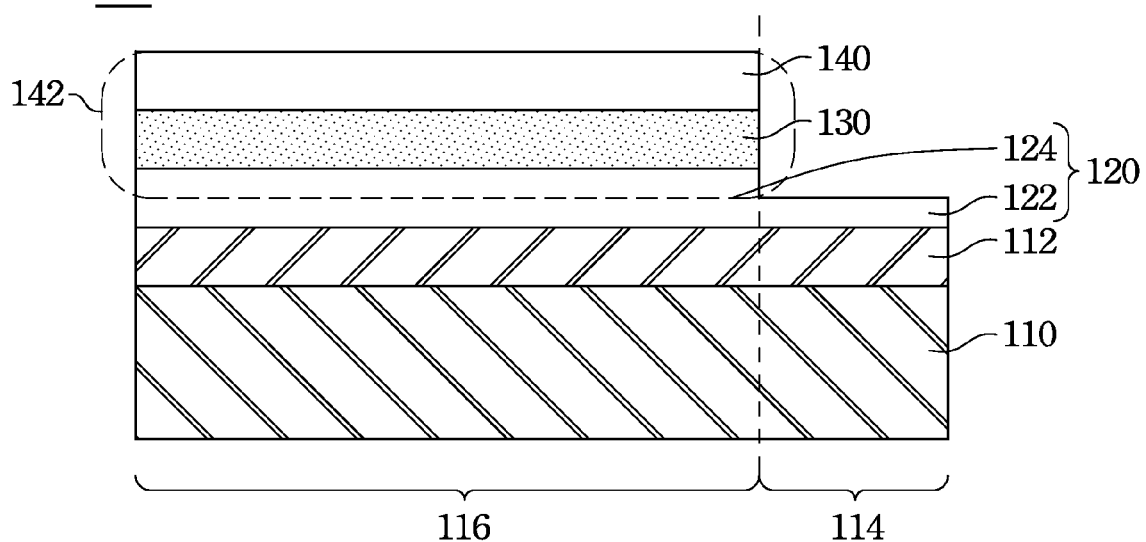
Figure 1C:
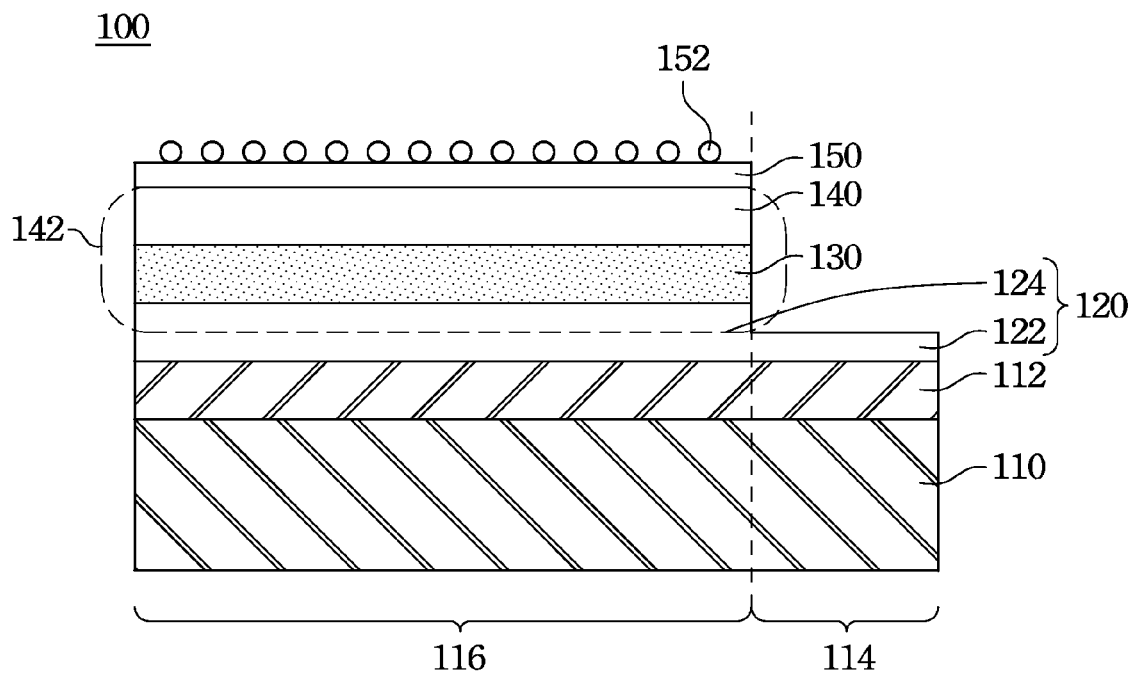
Figure 1D:
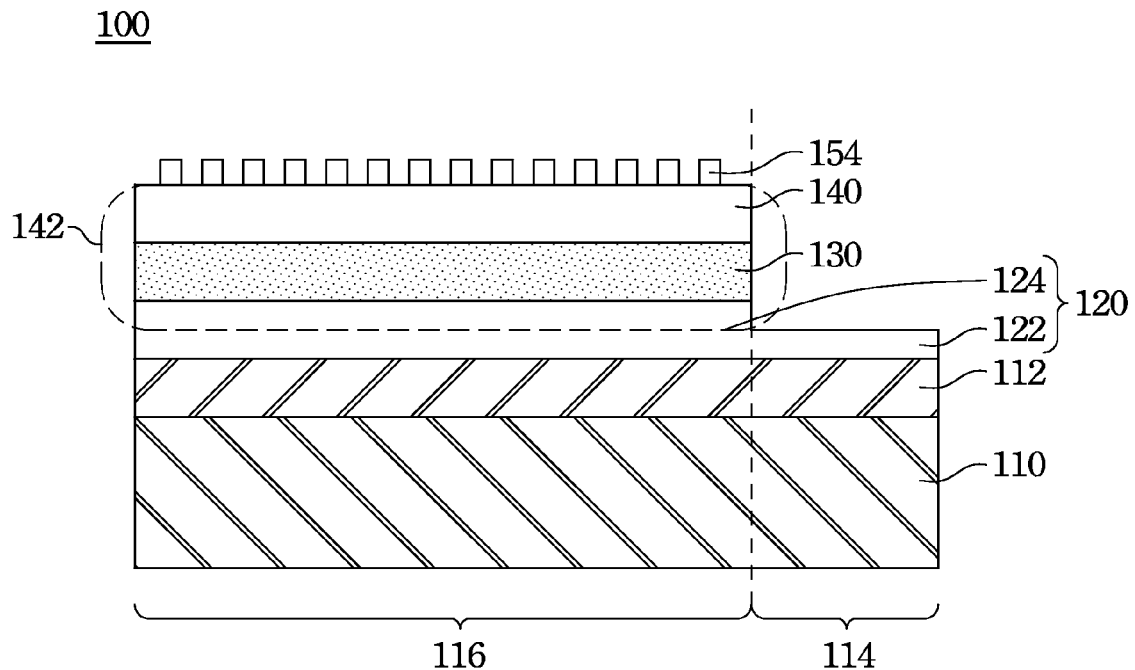
Figure 1E:
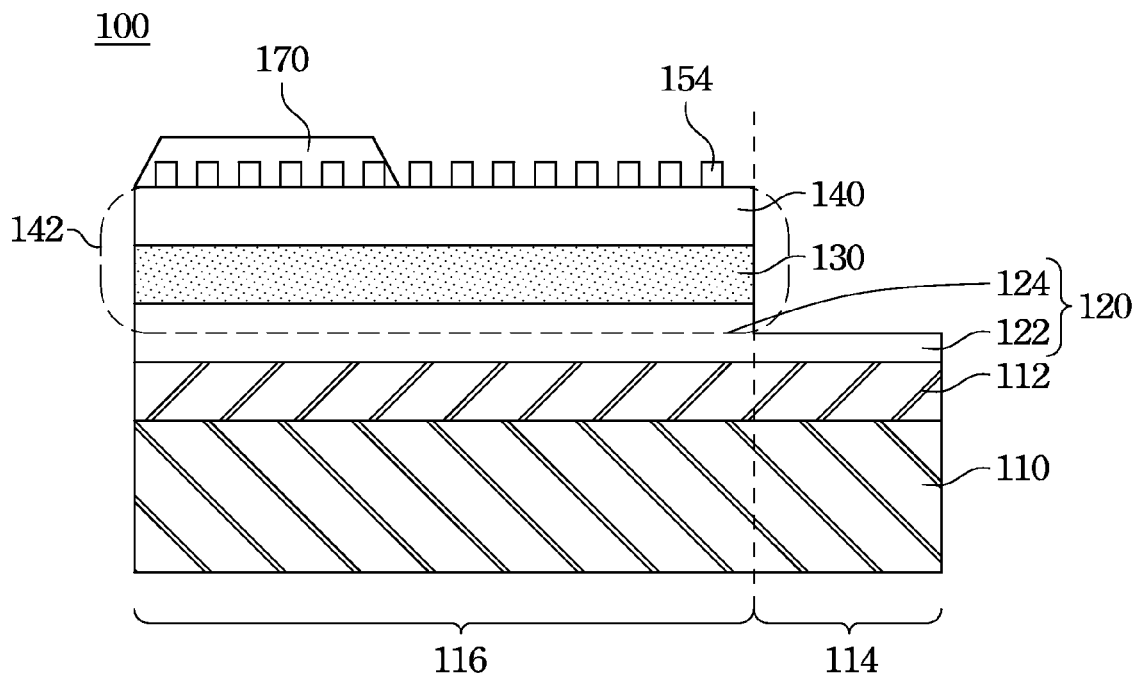
Figure 1F:
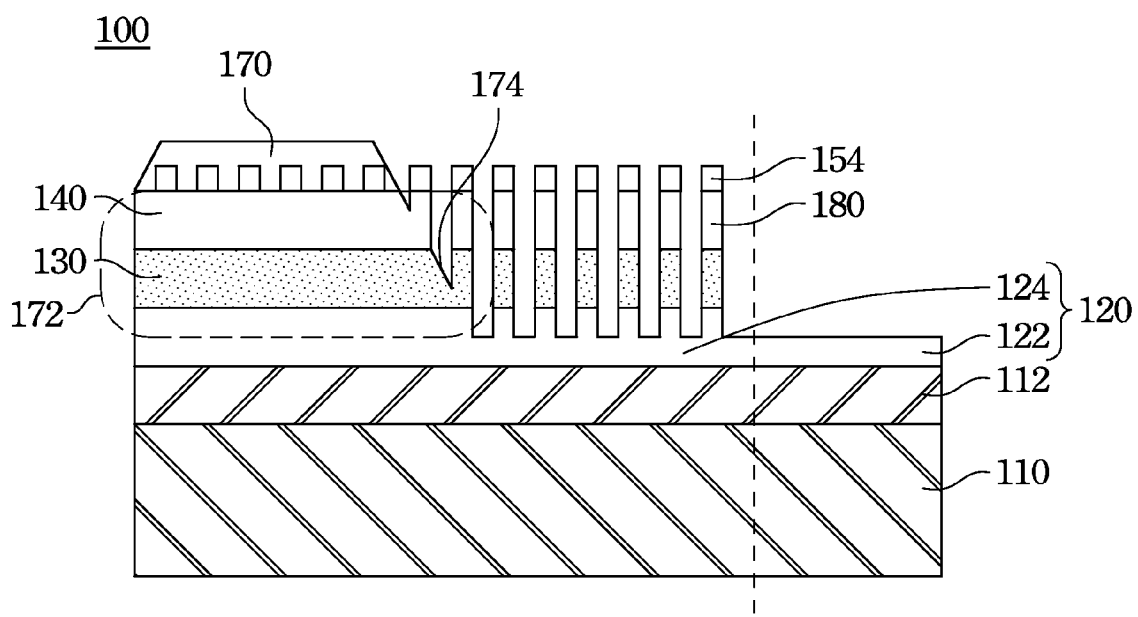
Figure 1G:
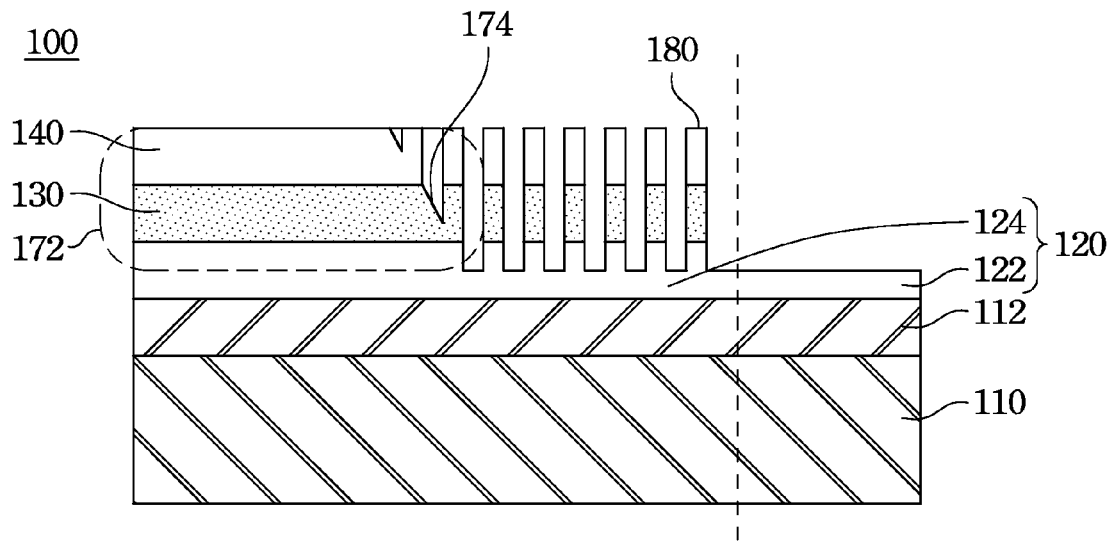
Figure 1H:
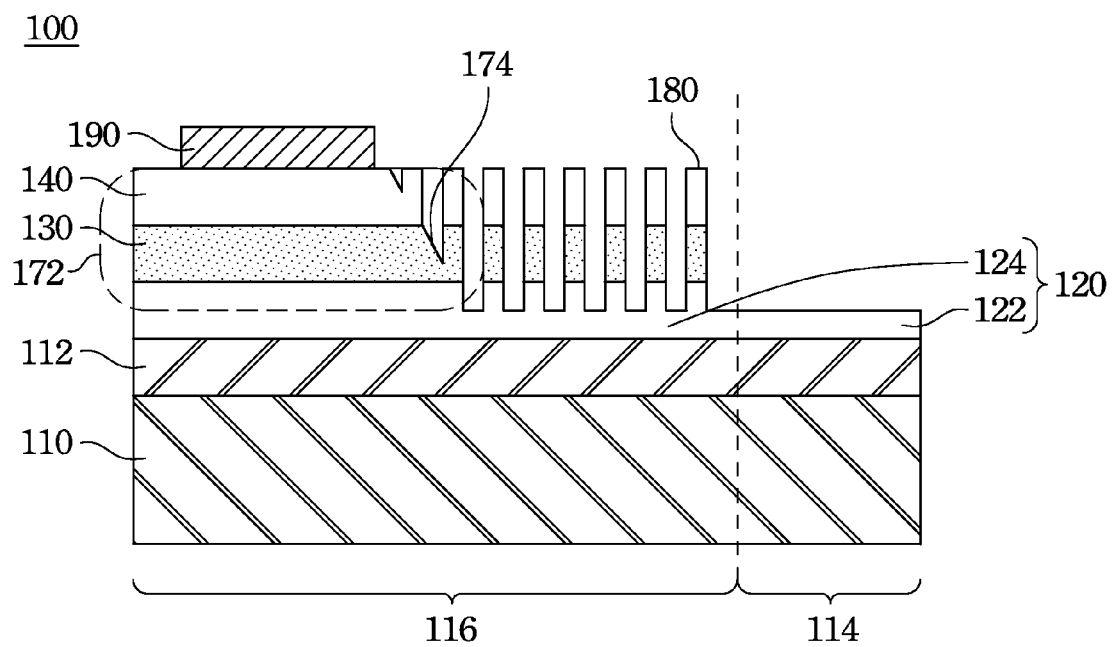
Figure 1I:
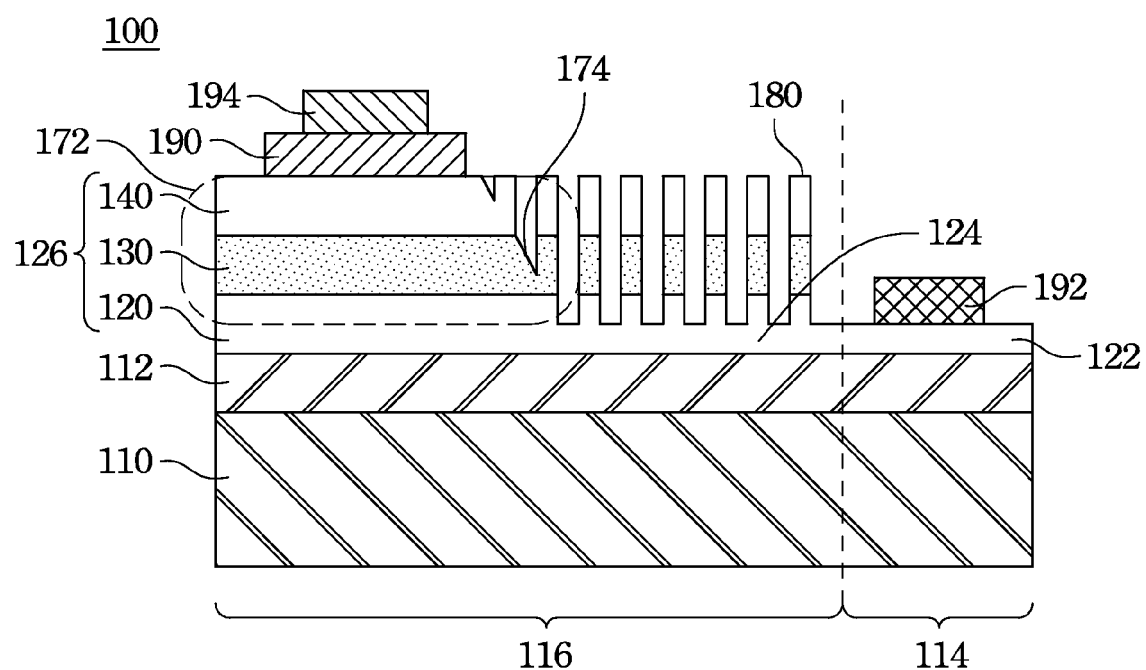

Refer to FIG. 1I, which is a cross-sectional view of a light emitting diode according to one embodiment of this invention. As shown in FIG. 1I, the light emitting diode 100 comprises a substrate 110, a cushion layer 112, a structural layer 126, a transparent conductive layer 190, a first contact pad 192 and a second contact pad 194. The cushion layer 112 is formed on the substrate 110, comprising a first area 114 and a second area 116. A first-type semiconductor layer 120 comprises a first portion 122 and a second portion 124 respectively disposed in the first area 114 and the second area 116. The structural layer 126 is disposed on the cushion layer 112 of the second area 116, and the structural layer 126 comprises the second portion 124 of the first-type semiconductor layer 120, a light emitting layer 130 and a second-type semiconductor layer 140. The light emitting layer 130 is disposed on the second portion 124 of the first-type semiconductor layer 120. The second-type semiconductor layer 140 is disposed on the light emitting layer 130. The above structural layer 126 is composed of a stacked structure 172 and nano columns 180, and the nano columns 180 are in regular arrange stretching from a trapezoid sidewall 174. The first contact pad 192 is disposed on the first-type semiconductor layer 120 in the first area 114. The transparent conductive layer 190 is disposed on the stacked structure 172 in the second area 116 of the structural layer 126. A second contact pad 194 is disposed on the transparent conductive layer 190.

The material of the substrate 110 is made of sapphire, silicon, glass, quartz, the combination thereof or other suitable material.

The cushion layer 112 is made of an undoped nitride semiconductor, which is a III-V group compound or II-VI group compound. In one embodiment, the cushion layer 112 is made of an undoped gallium nitride (GaN).

The structural layer 126 comprises the second portion 124 of the first-type semiconductor layer 120, the light emitting layer 130 and the second-type semiconductor layer 140. The first-type semiconductor layer 120 is an N-type semiconductor layer, made of an N-type impurity-doped nitride semiconductor, which is a III-V group compound or II-VI group compound. In one embodiment, the first-type semiconductor layer 120 is made an N-type gallium nitride (GaN).

The light emitting layer 130 is a multi-quantum well (MQW) layer. In one embodiment, the multi quantum well layer is composed of at least one gallium nitride (GaN) layer and at least one indium gallium nitride (InGaN) layer.

The second-type semiconductor layer 140 is made of a P-type semiconductor layer, made of a P-type impurity-doped nitride semiconductor, which is a III-V group compound or a II-VI group compound. In one embodiment, the second-type semiconductor layer 140 is a P-type gallium nitride (GaN).

In another embodiment, the ratio between the diameter of the nano columns 180 and the thickness of the structural layer ranges from 0.01 to 1, preferably 0.05 to 0.1. In yet another embodiment, the distance between the nano columns 180 ranges 1 to 500 nanometers (nm), preferably from 10 to 100 nm.

FIG. 1A to 1I are cross-sectional views illustrating process steps of fabricating a light emitting diode 100 according to one embodiment of this invention.

Refer to FIG. 1A, the first step is providing a substrate 110, and the next step is continuously forming a cushion layer 112, a first-type semiconductor layer 120, a light emitting layer 130 and a second-type semiconductor layer 140 using epitaxial growth process. In one embodiment, the step of forming the cushion layer 112, the first-type semiconductor layer 120, the light emitting layer 130 and the second-type semiconductor layer 140 is a chemical vapor deposition process or a metal-organic vapor deposition process.

Refer to FIG. 1B, the step is performing an photolithography and etching processes to define the first-type semiconductor layer 120, the light emitting layer 130 and the second-type semiconductor layer 140 for exposing the first-type semiconductor layer 120 in a first area 114, and forming a platform 142 composed of the first-type semiconductor layer 120, the light emitting layer 140 and a second-type semiconductor layer 140 in a position other than the first area 114. The etching process is a dry etching process or a wet etching process, and the dry etching process is an anisotriic etching.

Refer to FIG. 1C, the step is forming an insulating layer 150 on the platform 142, then the next step is coating a plurality of nano particles 152 regularly spaced on the insulating layer 150. In one embodiment, the material of the insulating layer 150 is silicon oxide (SiOx) or silicon nitride (SixNy). The above nano particles 152 can be metal nano particles, such as metal Ni nano particles. According to the actual demand, the metal nano particles can be removed by suitable acid etching solution known in the art.

Refer to FIG. 1D, the step is forming a plurality of nano-scale masks 154 regularly spaced on the platform 142. The process of forming the nano-scale masks 154 is nano imprint lithography process or photolithography etching process, and then the nano particles 152 are removed. In one embodiment, the etching process is reactive ion etching (RIE) process. In another embodiment, the shape of the nano-scale masks can be changed according to the actual demand of the light pattern.

Refer to FIG. 1E, a trapezoid hard mask 170 is formed on the platform 142 using any known process in the art, thus covering the nano-scale masks for forming a predetermined stacked structure of the light emitting diode.

Refer to FIG. 1F, the step is performing an anisotropic etching process to remove the platform 142 without covering the trapezoid hard mask 170 and the nano-scale masks 154, and to form a stacked structure 172 having a trapezoid sidewall 174 and nano columns 180 in regular arrange stretching from the trapezoid sidewall174. In this step, the first-type semiconductor layer 120 is an etching endpoint. The height of the nano columns 180 can be adjusted according to the current situation, which depends on the etching time and the etching endpoint. In one embodiment, the anisotropic etching process is inductively coupled plasma or reactive ion etching. In another embodiment, the etching rate is about from 100 to 3,000 Å/min, preferably about from 1500 to 2500 Å/minute, more preferably about 2,000 Å/min.

Refer to FIG. 1G, the step of removing the trapezoid hard mask 170 and the nano-scale masks 154 can be any process. In one embodiment, the wet etching process is mixing hydrofluoric acid (HF) and ammonium fluoride (NH$_4$H), thus obtaining a buffered oxide etch (BOE) solution to remove the trapezoid hard mask 170 and the nano-scale masks 154.

Refer to FIG. 1H, a transparent conductive layer 190 is formed on the second-type semiconductor layer 140 of the stacked structure 172 having a trapezoid sidewall 174.

Refer to FIG. 1I, a first contact pad 192 is formed on the first-type semiconductor layer 120 in the first area 114; and a second contact pad 194 is formed on the transparent conductive layer 190.

According to the above-mentioned embodiments, the present invention discloses a light-emitting diode, which has nano columns extending from a trapezoid sidewall in regular arrangement, including a range of the trapezoid sidewall and the second-type semiconductor layer. The light-emitting diode can uniformly emit light, and enhance the brightness of the LED, thus solve the defects of the conventional light-emitting diode with insufficient luminous efficiency.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting diode comprising:
   a substrate having a surface with a cushion layer thereon with a first area and a second area;
   a first-type semiconductor layer comprising a first portion and a second portion located in the first area and the second area, respectively;
   a structural layer disposed on the second area of the cushion layer, comprising:
   the second portion of the first-type semiconductor layer;
   a light emitting layer disposed on the second portion of the first-type semiconductor layer; and
   a second-type semiconductor layer disposed on the light emitting layer, wherein the structural layer is composed of a stacked structure having a trapezoid sidewall and nano columns, the trapezoid sidewall has an inclined surface, and a portion of the nano columns extends from the inclined surface in regular arrangement;
   a transparent conductive layer disposed on the stacked structure of the structural layer in the second area of the cushion layer;
   a first contact pad disposed on the first portion of the first-type semiconductor layer in the first area of the cushion layer; and
   a second contact pad disposed on the transparent conductive layer.

2. The light emitting diode of claim 1, wherein the ratio of the diameter of the nano columns and the thickness of the structural layer is in a range of 0.01 to 1.

3. The light emitting diode of claim 2, wherein the space between the respective nano columns is in a range of 1 to 500 nm.

4. The light emitting diode of claim 1, wherein the substrate is made of a sapphire substrate or a silicon substrate.

5. The light emitting diode of claim 1, wherein the cushion layer is made of an undoped nitride semiconductor.

6. The light emitting diode of claim 1, wherein the first-type semiconductor layer is an N-type semiconductor layer, and the second-type semiconductor layer is a P-type semiconductor layer.

7. The light emitting diode of claim 6, wherein the N-type semiconductor layer is made of an N-type impurity-doped nitride semiconductor, and the P-type semiconductor layer is made of a P-type impurity-doped nitride semiconductor.

8. The light emitting diode of claim 7, wherein the first-type semiconductor layer is an N-type gallium nitride layer, and the second-type semiconductor layer is a P-type gallium nitride layer.

9. The light emitting diode of claim 1, wherein the light emitting layer is a multi-quantum well layer.

10. The light emitting diode of claim 9, wherein the multi-quantum well layer comprises at least one gallium nitride layer and at least one indium gallium nitride layer.

* * * * *